United States Patent
Wang

(10) Patent No.: US 10,432,196 B2
(45) Date of Patent: *Oct. 1, 2019

(54) COMMUNICATION DEVICE, COMMUNICATION SYSTEM AND OPERATION METHOD THEREOF

(71) Applicant: Nuvoton Technology Corporation, Hsinchu (TW)

(72) Inventor: Cheng-Chih Wang, Hsinchu (TW)

(73) Assignee: Nuvoton Technology Corporation, Hsinchu (TW)

(*) Notice: Subject to any disclaimer, the term of this patent is extended or adjusted under 35 U.S.C. 154(b) by 197 days.

This patent is subject to a terminal disclaimer.

(21) Appl. No.: 15/627,459

(22) Filed: Jun. 20, 2017

(65) Prior Publication Data

US 2017/0294912 A1 Oct. 12, 2017

Related U.S. Application Data

(63) Continuation-in-part of application No. 15/135,544, filed on Apr. 21, 2016, now Pat. No. 9,716,503.

(30) Foreign Application Priority Data

Jul. 22, 2015 (TW) .............................. 104123709 A

(51) Int. Cl.
  *H03K 19/00* (2006.01)
  *H03K 19/177* (2006.01)
  *H03K 17/16* (2006.01)

(52) U.S. Cl.
  CPC ..... *H03K 19/0013* (2013.01); *H03K 19/1776* (2013.01); *H03K 19/17776* (2013.01); *H03K 17/164* (2013.01); *H03K 19/0005* (2013.01)

(58) Field of Classification Search
  CPC .... G06F 17/50; H03K 19/00; H03K 19/0013; H03K 19/173; H03K 19/177; H03K 19/1776
  (Continued)

(56) References Cited

U.S. PATENT DOCUMENTS 6,317,367 B1   11/2001  Sample et al.
6,631,520 B1   10/2003  Theron et al.
(Continued)

FOREIGN PATENT DOCUMENTS

CN   103530263   1/2014
CN   103544113   1/2014
TW   200503491   1/2005

OTHER PUBLICATIONS

"Office Action of Taiwan Counterpart Application", dated Apr. 2, 2018, p. 1-p. 3.

*Primary Examiner* — Zhiren Qin
(74) *Attorney, Agent, or Firm* — JCIPRNET

(57) ABSTRACT

A communication device, a communication system and an operation method thereof are provided. The communication device includes a micro-controller unit (MCU) and a field programmable gate array (FPGA). The FPGA is coupled to the MCU, and is configured to execute a first communication protocol to work with the MCU so as to communicate with another communication device in a first period, and meanwhile the FPGA is programmed with a second communication protocol by the MCU in the same first period. The FPGA is controlled by a switch pulse output from the MCU to terminate the first period, and switched from the first communication protocol to the second communication protocol, and then executes the second communication protocol to work with the MCU so as to communicate with the another communication device in a second period.

9 Claims, 5 Drawing Sheets

---

S610 — In a first period, a FPGA executes the first function to work with a MCU, and meanwhile the MCU programs a second function to the FPGA S620 — The MCU outputs a switch pulse to terminate the first period, and make the FPGA to switch from the first function to the second function, and the FPGA executes the second function to work with the MCU in a second period

(58) Field of Classification Search
USPC .................................................. 326/38, 39
See application file for complete search history.

(56) References Cited

U.S. PATENT DOCUMENTS

| | | |
|---|---|---|
| 7,068,069 B2 | 6/2006 | Fujita |
| 7,193,436 B2 | 3/2007 | Wang et al. |
| 7,516,303 B2 | 4/2009 | Kundu et al. |
| 8,205,488 B2* | 6/2012 | Proksch ................ B82Y 35/00 73/105 |
| 8,725,862 B1* | 5/2014 | Yang ................... G06F 16/3331 709/223 |
| 8,754,670 B2* | 6/2014 | Kim .................. H03K 19/17704 326/38 |
| 9,059,901 B1* | 6/2015 | Kumar C S ............ H04L 45/02 |
| 2005/0177633 A1* | 8/2005 | Plunkett ............... B41J 2/04505 709/225 |
| 2005/0213761 A1 | 9/2005 | Walmsley et al. |
| 2009/0237113 A1* | 9/2009 | Marui ............. H03K 19/17736 326/39 |
| 2013/0027079 A1 | 1/2013 | Nazarian et al. |

* cited by examiner

COMMUNICATION DEVICE, COMMUNICATION SYSTEM AND OPERATION METHOD THEREOF

CROSS-REFERENCE TO RELATED APPLICATION

This application is a continuation-in-part application of and claims the priority benefit of U.S. application Ser. No. 15/135,544, filed on Apr. 21, 2016, now allowed, which claims the priority benefit of Taiwan application serial no. 104123709, filed on Jul. 22, 2015. The entirety of each of the above-mentioned patent applications is hereby incorporated by reference herein and made a part of this specification.

BACKGROUND OF THE PRESENT DISCLOSURE

Field of the Present Disclosure

The present disclosure relates to an electronic circuit, and more particularly, to a communication device, a communication system and an operation method thereof.

Description of Related Art

Because of the capabilities of micro-controller units (MCU) circuit to highly integrate other elements and working with various peripheral elements/circuits (e.g., circuits with calculating functions, logic circuits, and/or memories), they are widely used in products e.g. automotive devices, hand held devices. Field programmable gate array (FPGA) is a configurable integrated circuit, where an internal configurable logic block (CLB) thereof can be programmed. In conventional technology, when the FPGA with a certain original function is configured to work with a MCU, a programming platform (or programming circuit) is not capable of programming a new function to the FPGA. During the process that the programming platform (or programming circuit) programms a new function to the FPGA, the conventional FPGA is unable to provide any function (including the certain original function and the new function) to the MCU. It often takes a long time to program a new function to the FPGA. The FPGA cannot use the new function to work with the MCU until the new function is completely programmed into the FPGA.

The FPGA and the MCU can be applied to communication devices. The FPGA and the MCU may provide a bottom layer (e.g., a physical layer) communication function. Based on programming, the FPGA may have a communication interface used for implementing data transmission with a remote system (another communication device). The two communication devices may exchange data through an encrypted communication network. The conventional communication device performs encryption on data to be transmitted, and then uses a fixed (unchanged) communication protocol to transmit the encrypted data to the other communication device. The communication protocol between communication interfaces of the two conventional communication devices is not changed. Although the data transmitted there between has been encrypted, since the communication protocol is well known by a hacker, especially a radio communication network cannot prevent the hacker from monitoring such communication network. In case that the communication protocol is fixed (unchanged), the hacker may intercept data and analyze the same for decryption through the communication protocol.

SUMMARY OF THE PRESENT DISCLOSURE

Accordingly, the present disclosure is directed to a communication device, a communication system and an operation method thereof in order to improve security of a communication network.

The invention provides a communication device including a micro-controller unit (MCU) and a field programmable gate array (FPGA). The FPGA is coupled to the MCU and configured to execute a first communication protocol to work with the MCU so as to communicate with another communication device in a first period, and meanwhile the FPGA is programmed with a second communication protocol by the MCU in the same first period. The FPGA is controlled by a switch pulse output by the MCU to terminate the first period, and switched from the first communication protocol to the second communication protocol, and then executes the second communication protocol to work with the MCU so as to communicate with the another communication device in a second period.

The invention provides an operation method of a communication device including following steps. In a first period, a first communication protocol is executed by a FPGA to work with a MCU so as to communicate with another communication device, and meanwhile the FPGA is being programmed with a second communication protocol by the MCU in the same first period. The MCU outputs a switch pulse to terminate the first period, and make the FPGA to switch from the first communication protocol to the second communication protocol. The FPGA execute the second communication protocol to work with the MCU so as to communicate with the another communication device in a second period.

The invention provides a communication system including a first communication device and a second communication device. The second communication device includes a MCU and a FPGA. The FPGA is coupled to the MCU. The FPGA is configured to execute a first communication protocol to work with the MCU so as to communicate with the first communication device in a first period, and meanwhile the FPGA is programmed with a second communication protocol by the MCU in the same first period. The FPGA is controlled by a switch pulse output by the MCU to terminate the first period, and switched from the first communication protocol to the second communication protocol. The FPGA executes the second communication protocol to work with the MCU so as to communicate with the first communication device in a second period.

Based on the above, the FPGA and the MCU described in the embodiments of the present disclosure work together so as to communicate with another communication device. While the MCU programs the new communication protocol (the second communication protocol) to the FPGA, the FPGA is capable of executing the original communication protocol (the first communication protocol) and working with the MCU so as to communicate with the another communication device. When the FPGA receives the switch pulse from the MCU, the FPGA is capable of switching from the first communication protocol to the second communication protocol instantly, without wasting time for programming or converting. Therefore, the communication devices of the embodiment of the disclosure may keep repeatedly changing the communication protocol to improve security of data transmission of the communication network.

To make the aforementioned and other features and advantages of the present disclosure more comprehensible, several embodiments accompanied with drawings are described in detail as follows.

BRIEF DESCRIPTION OF THE DRAWINGS

The accompanying drawings are included to provide a further understanding of the present disclosure, and are incorporated in and constitute a part of this specification. The drawings illustrate embodiments of the present disclosure and, together with the description, serve to explain the principles of the disclosure.

DESCRIPTION OF THE EMBODIMENTS

Figure 1:
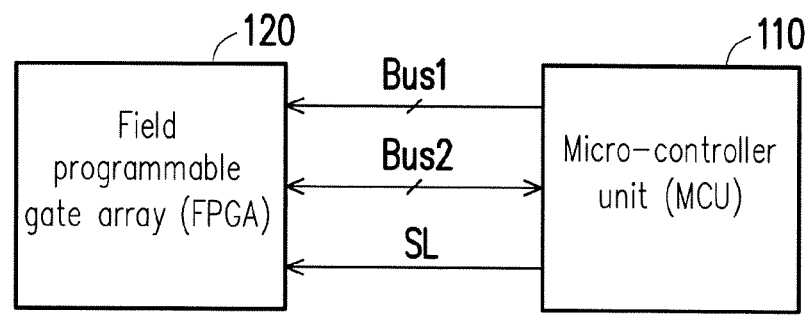
FIG. 1 is a circuit block diagram of a function programmable circuit according to an embodiment of the disclosure.

A term "couple (or connect)" used in the full text of the disclosure (including the claims) refers to any direct and indirect connections. For example, if a first device is described to be coupled (or connected) to a second device, it is interpreted as that the first device is directly coupled to the second device, or the first device is indirectly coupled to the second device through other devices or connection means. Moreover, wherever possible, components/members/steps using the same referential numbers in the drawings and description refer to the same or like parts. Components/members/steps using the same referential numbers or using the same terms in different embodiments may cross-refer.

Refer to FIG. 1. FIG. 1 is a block diagram of a function programmable circuit 100 according to an embodiment of the disclosure. The function programmable circuit 100 of the present embodiment includes a micro-controller unit (MCU) 110 and a field programmable gate array (FPGA) 120, and the MCU 110 is coupled to the FPGA 120. The MCU 110 can be a micro-processor, a micro-controller, or a central processing unit (CPU), or other circuits/elements having multifunction integration and processing capabilities. The FPGA 120 can be any programmable logic device, but no particular limitation is set in the present disclosure. In the present embodiment, the FPGA 120 is configured/programmed to have a function (e.g., a first function, FUNC_1).

The FPGA 120 is capable of executing the first function FUNC_1 and working with MCU 110 in a first period.

Figure 2:
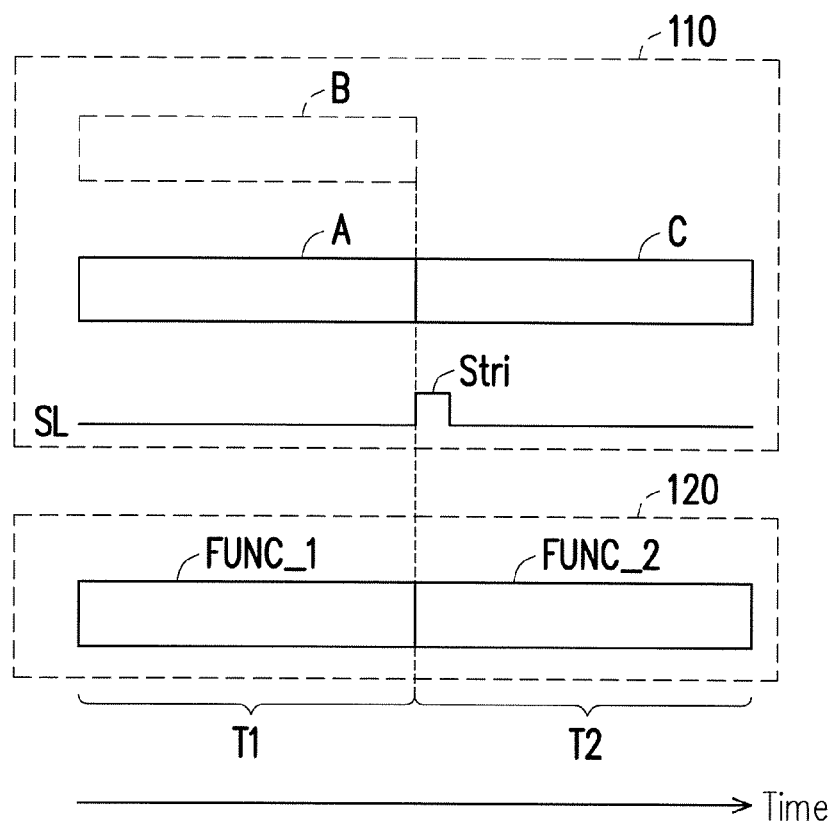
FIG. 2 is a schematic diagram of an operation timing of the function programmable circuit of FIG. 1 according to an embodiment of the disclosure.

Next, referring to both FIG. 1 and FIG. 2, FIG. 2 is a schematic diagram of an operation timing of the function programmable circuit 100 of FIG. 1 according to an embodiment of the disclosure. In FIG. 2, a horizontal axis represents time. In a first period T1, the FPGA 120 has the first function FUNC_1, and the MCU 110 executes a task A so as to work with the FPGA 120. For example (but not limited to the following), the MCU 110 is capable of controlling the FPGA 120 via an interconnect bus Bus2, thereby causing the FPGA 120 to execute the first function FUNC_1. Note that at the time the MCU 110 executes the task A, it also executes a task B, so as to program a new function (e.g., a second function FUNC_2) to the FPGA 120 via a programming bus Bus1. In other words, in addition that the FPGA 120 executes the first function FUNC_1 and works with the MCU 110 in the first period T1, the MCU 110 also programs the second function FUNC_2 to the FPGA 120. The programming of the second function FUNC_2 does not affect/interrupt the execution of the first function FUNC_1.

Next, after completely programming the second function FUNC_2 to the FPGA 120, the MCU 110 may output a switch pulse Stri to the FPGA 120 via a control signal line SL. After receiving the switch pulse Stri, the FPGA 120 terminates the first period T1 and is switched from the first function FUNC_1 to the second function FUNC_2. In a second time period T2 after the first period T1, the MCU 110 may execute a task C so as to work with the FPGA 120. As an example (but not limited to the following), the MCU 110 controls the FPGA 120 via the interconnect bus Bus2 while executing the task C, causing the FPGA 120 to execute the second function FUNC_2 in the second period T2.

In other words, the FPGA 120 is controlled by the switch pulse Stri outputted by the MCU 110. The FPGA 120 receives the switch pulse Stri to terminate the first period T1, and is switched from the first function FUNC_1 to the second function FUNC_2, and in the second period T2, the FPGA 120 executes the second function FUNC_2 to work with the MCU 110. A user end may adjust the MCU 110 by software to generate the switch pulse Stri, or the switch pulse Stri may be generated by pre-setting the MCU 110, which is not limited by the disclosure.

To be specific, in the present embodiment, the MCU 110 is used for controlling the FPGA 120. In the first period T1, the MCU 110 is capable of programming the second function FUNC_2 to the FPGA 120 while controlling the FPGA 120 to execute the first function FUNC_1. In case that the first function FUNC_1 executed by the FPGA 120 is not stopped, the MCU 110 is capable of programming the second function FUNC_2 to the FPGA 120. Since the second function FUNC_2 is already programmed to the FPGA 120 during a period that the FPGA 120 executes the first function FUNC_1, the FPGA 120 can be instantly switched from the first function FUNC_1 to the second function FUNC_2 without wasting time to wait for programming of the MCU.

Figure 3:
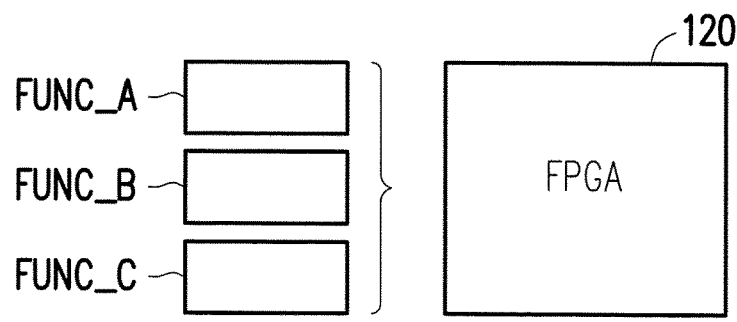
FIG. 3 is a schematic diagram of an operation of the FPGA of FIG. 1, according to another embodiment of the disclosure.
Figure 4:
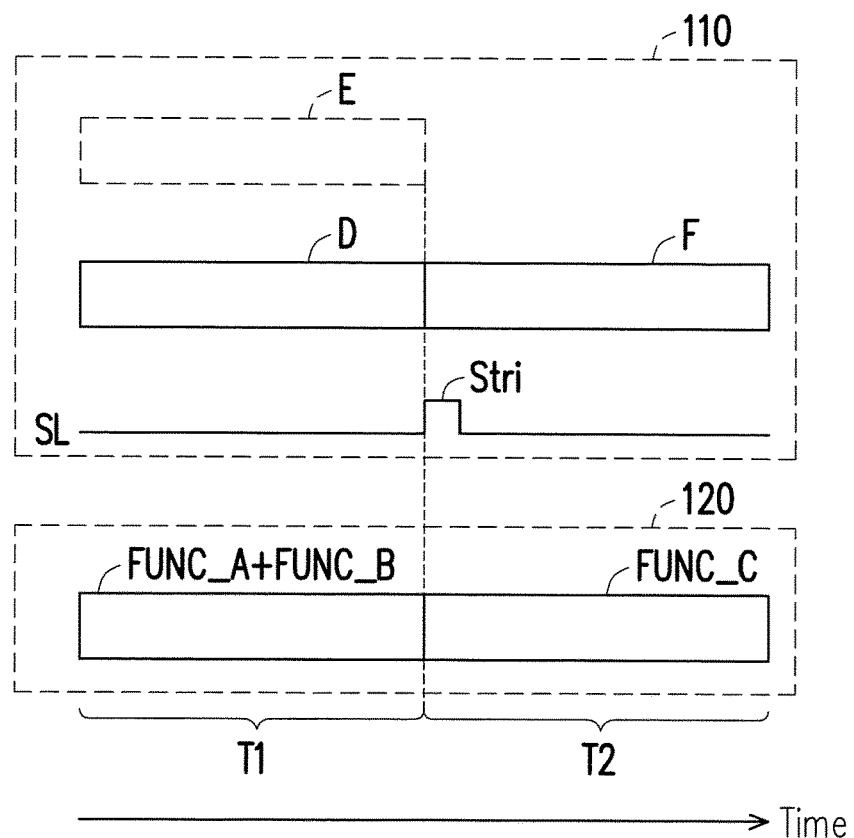
FIG. 4 is a schematic diagram of an operation timing of the function programmable circuit of FIG. 3 according to another embodiment of the disclosure.

Referring to both FIG. 3 and FIG. 4. FIG. 3 is a schematic diagram of an operation of the FPGA 120 of FIG. 1 according to another embodiment of the disclosure. FIG. 4 is a schematic diagram of an operation timing of the FPGA 120 of FIG. 3 according to another embodiment of the disclosure. It is assumed that the FPGA 120 of the present embodiment has 10K transistors, and the FUNC_A, the FUNC_B, and the FUNC_C require 3K, 5K, and 10K transistors, respectively.

In the first period T1 of FIG. 4, the FPGA 120 has the functions FUNC_A and the FUNC_B, and the MCU 110 is capable of executing a task D, so as to work with the FPGA 120. For instance, but not limited to the following, the MCU 110 is capable of controlling the FPGA 120 via the interconnect bus Bus2, to execute the function FUNC_A and the FUNC_B. Note that in the first period T1, the MCU 110 also executes a task E while executing the task D, so as to program a new function (e.g., the function FUNC_C) to the FPGA 120 via the programming bus Bus1. Programming of the function FUNC_C does not affect/interrupt the execution of the functions FUNC_A and FUNC_B.

Then, the first period T1 is terminated and the FPGA 120 is switched from the FUNC_A and the FUNC_B to the FUNC_C when the FPGA 120 receives the switch pulse Stri from the MCU 110 via the control signal line SL. In the second period T2, the MCU 110 is capable of executing a task F so as to work with the MCU 110. For instance, but not limited to the following, the MCU 110 controls the FPGA 120 via the interconnect bus Bust while executing the task F, and causes the FPGA 120 to execute the second function FUNC_C in the second period T2.

According to the above description, it is known that though the FUNC_A, the FUNC_B, and the FUNC_C cannot be burned to the FPGA 120 at the same time (because that the total number of the transistors required by the three functions already exceeds the total number of transistors of the FPGA 120), by means of switching functions of the FPGA 120, the limited number of the transistors of the FPGA 120 is capable of realizing more functions.

Figure 5:
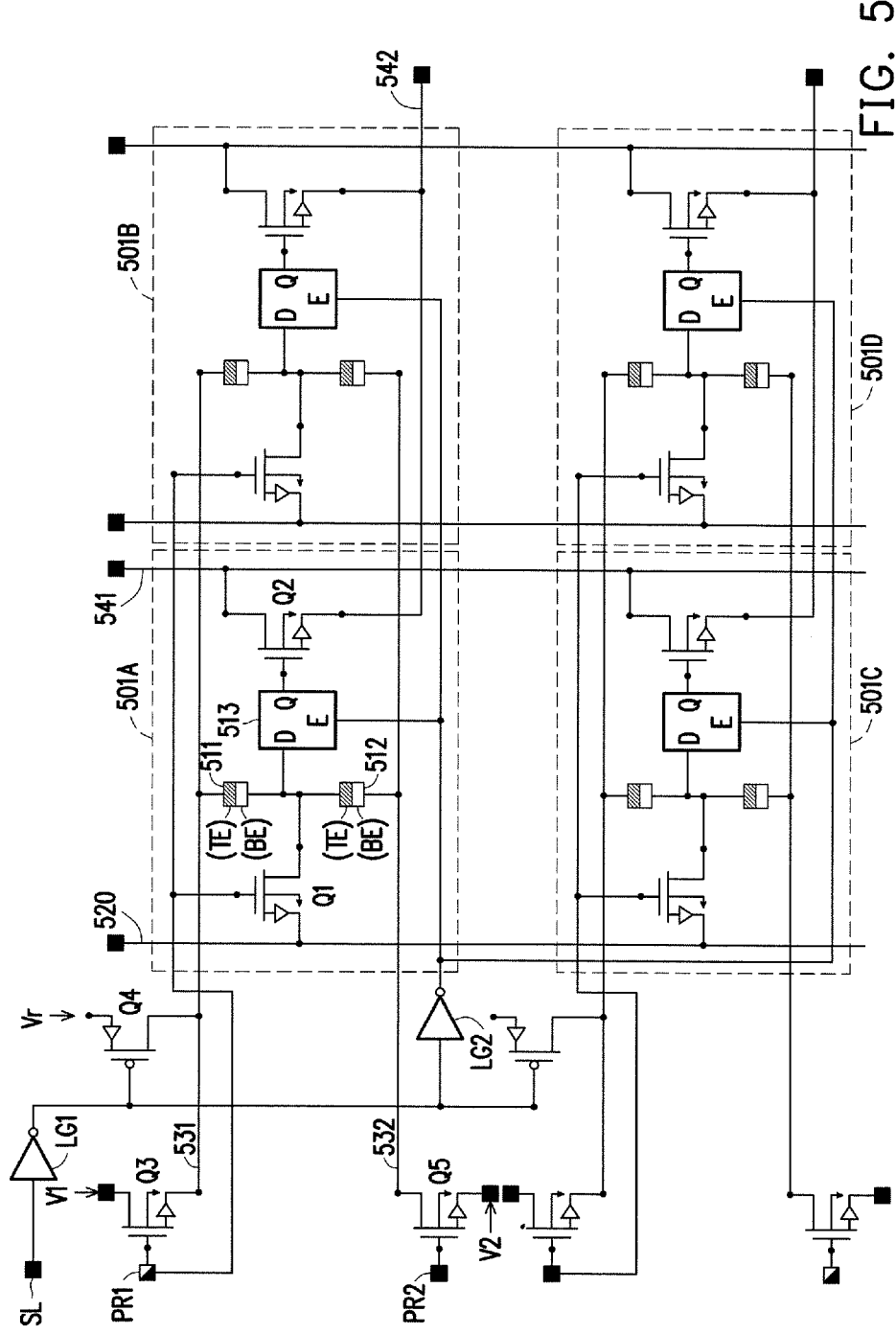
FIG. 5 is a schematic diagram of a circuit structure of a FPGA of FIG. 1 according to an embodiment of the disclosure.

Referring to FIG. 5, FIG. 5 is a schematic diagram of a circuit structure of the FPGA 120 of FIG. 1 according to an embodiment of the disclosure. The FPGA 120 of the present embodiment includes a plurality of memory blocks, e.g. memory blocks 501A, 501B, 501C, and 501D of FIG. 5. In the following description, the memory block 501A is used as an example for description, and description of the other memory blocks may be deduced with reference of related description of the memory block 501A. The memory block 501A includes a first switch Q1, a first resistive nonvolatile memory element 511, a second resistive nonvolatile memory element 512, a latch unit 513, and a second switch Q2. The above described first switch Q1 and the second switch Q2 can be metal-oxide semi-conductor field-effect transistors, (MOSFET), bipolar junction transistor (BJT), or other switch circuits/elements. For instance, the first switch Q1 and the second switch Q2 of the present embodiment can be N-type metal-oxide-semiconductor (NMOS) field-effect transistors. The latch unit 513 may include a latch, a flip-flop, or another circuit/element capable of storing data. The latch unit 513 of the present disclosure is not particularly limited.

The above described first resistive nonvolatile memory element 511 and the second resistive nonvolatile memory element 512 may adopt different implementation methods depending on different design demands. For instance, the first resistive nonvolatile memory element 511 may include a top electrode TE, a variable resistor, and a bottom electrode BE, where the variable resistor is disposed between the top electrode TE and the bottom electrode BE. A material of the bottom electrode BE may be a YBa$_2$Cu$_3$O$_7$ (YBCO) film or TiN, or oxides, nitrides, or oxygen nitride of an element selected from manganese, iron, nickel, cobalt, titanium, copper, vanadium, silicon, or a combination thereof (e.g., Ti, SiO$_2$.Si). A material of the described variable transistor may be a PrI-XCaXMnP$_3$ (PCMO) film, or a ZnSe—Ge heterogeneous structure, or an oxide related to Ti.Nb.Hf.Zr.Ta-.Ni.V.Zn.Sn.In.Th.Al (e.g., a HfO$_2$ film). A material of the above described top electrode TE may be an Ag film or a TiN flan deposited by sputtering. Along with changes in materials or manufacturing conditions of the top electrode TE, variable resistor and the bottom electrode BE, a resistance and a clamp voltage of the first resistive nonvolatile memory element 511 may be varied. By adjusting a direction and a magnitude of the voltage between the top electrode TE and the bottom electrode BE of the first resistive nonvolatile memory element 511, a resistance state of the first resistive nonvolatile memory element 511 can be changed, such that nonvolatile logic values of the memory blocks 501A~501D are adjusted. Description of the second resistive nonvolatile memory element 512 may be deduced according to related description of the first resistive nonvolatile memory element 511.

In the memory block 501A, a control terminal (e.g., a gate) of the first switch Q1 receives a first control signal PR1. A first terminal (e.g., a source) of the first switch Q1 is coupled to a column programming line 520, and a second terminal (e.g., a drain) of the first switch Q1 is coupled to the bottom electrode BE of the first resistive nonvolatile memory element 511. The top electrode TE of the first resistive nonvolatile memory element 511 is coupled to a first row line 531, and the bottom electrode BE of the first resistive nonvolatile memory element 511 is coupled to the top electrode TE of the second resistive nonvolatile memory element 512. The bottom electrode BE of the second resistive nonvolatile memory element 512 is coupled to a second row line 532. A data input terminal D of the latch unit 513 is coupled to the bottom electrode BE of the first resistive nonvolatile memory element 511 and the top electrode TE of the second resistive nonvolatile memory element 512. A control terminal (e.g., a gate) of the second switch Q2 is coupled to a data output terminal Q of the latch unit 513, a first terminal (e.g., a drain) of the second switch Q2 is coupled to an input line 541 of the FPGA 120, and a second terminal (e.g., a source) of the second switch Q2 is coupled to an output line 542 of the FPGA 120.

The FPGA 120 also includes a third switch Q3, a fourth switch Q4, a fifth switch Q5, a first logic gate LG1, and a second logic gate LG2. The above described third switch Q3, fourth switch Q4, and fifth switch Q5 can be MOSFETs, BJTs, or other switch circuits/elements. For instance (but not limited to the following), the third switch Q3 and the fifth switch Q5 can be NMOSs, and the fourth transistor Q4 can be a PMOS. A control terminal (e.g., a gate) of the third switch Q3 receives the first control signal PR1. A first terminal (e.g., a source) of the third switch Q3 is coupled to the first row line 531, and a second terminal (e.g., a drain) of the third switch Q3 is configured to receive a first voltage V1. A first terminal (e.g., a drain) of the fourth switch Q4 is coupled to the first row line 531, and a second terminal (e.g., a source) of the fourth switch Q4 is configured to receive a read voltage Vr. A control terminal (e.g. a gate) of the fifth switch Q5 receives a second control signal PR2, a first terminal (e.g., a source) of the fifth switch Q5 is configured to receive a second voltage V2, and a second terminal (e.g., a drain) of the fifth switch Q5 is coupled to the second row line 532. An input terminal of the first logic gate LG1 is coupled to the signal line SL for receiving the switch pulse Stri, and an output terminal of the first logic gate LG1 is coupled to the control terminal (e.g., the gate) of the fourth switch Q4. An input terminal of the second logic gate LG2 is coupled to the output terminal of the first logic gate, and an output terminal of the second logic gate LG2 is coupled to a gate terminal E of the latch unit 513 of each of the memory blocks 501A~501D.

When the FPGA 120 is in the first period T1, a logic level of the control signal line SL is at a low level, such that the latch unit 513 keeps outputting a first logic level corresponding to the original function (e.g., the first function) to the control terminal of the second switch Q2. In other words, during the period of the logic level of the control signal line SL being at the low level, the signal outputted by the output terminal Q of the latch unit 513 is not related to the input signal of the data input terminal D of the latch unit 513. In this case, the MCU 110 may turn on the first switch Q1, the third switch Q3 and the fifth switch Q5, and program a resistance state corresponding to a new function (e.g., the second function) to the first resistive nonvolatile memory element 511 and/or the second resistive nonvolatile memory element 512 via the first row line 531, the second row line 532 and the column programming line 520.

For instance, it is assumed that the first voltage V1 is set to be a high level voltage HV (e.g., higher than a clamp voltage of the first resistive nonvolatile memory element 511, but two times lower than the clamp voltage), and a second voltage V2 is set to be a low level voltage LV (e.g., a ground voltage or 0 voltage). In the first period T1, the first voltage V1 is transmitted to the top electrode TE of the first resistive nonvolatile memory element 511 through the third switch Q3 and the first row line 531, and the second voltage V2 is transmitted to the bottom electrode BE of the second resistive nonvolatile memory element 512 through the fifth switch Q5 and the second row line 532. At this time, if the low level voltage (e.g., the ground voltage or 0 voltage) is transmitted to the bottom electrode BE of the first resistive nonvolatile memory element 511 through the column programming line 520 and the first switch Q1, the first resistive nonvolatile memory element 511 is set, and a resistance state of the first resistive nonvolatile memory element 511 is changed to a low resistance state. A resistance value of the described low resistance state is above hundreds of ohm (e.g., several KΩ). Since a voltage difference between the top electrode TE and the bottom electrode BE of the second resistive nonvolatile memory element 512 is smaller than the clamp voltage thereof, the resistance state of the second resistive nonvolatile memory element 512 is kept at a high resistance state. A resistance value of the described high resistance state is at least tens times greater than the resistance value of the low resistance state (e.g., 10K~100MΩ).

Conversely, if the high level voltage HV is transmitted to the top electrode TE of the second resistive nonvolatile memory element 512 through the column programming line 520 and the first switch Q1, and the second voltage V2 having the low level voltage LV is transmitted to the bottom electrode BE of the second resistive nonvolatile memory element 512 through the fifth switch Q5 and the second row line 532, the second resistive nonvolatile memory element 512 is set, and the resistance state of the second resistive nonvolatile memory element 512 is changed to the low resistance state. Since voltages of the top electrode TE and the bottom electrode BE of the first resistive nonvolatile memory element 511 are both the high level voltage HV, the resistance state of the first resistive nonvolatile memory element 511 is kept at a high resistance state.

To perform a "reset" operation to change the resistance state of the first resistive nonvolatile memory element 511 from the low resistance state to the high resistance state, the first voltage V1 can be set to the low level voltage LV; and the second voltage V2 can be set to an erase voltage EV (e.g., higher than the clamp voltage of the resistive nonvolatile memory element 511, but lower than twice of the clamp voltage). The second voltage V2 is transmitted to the bottom electrode BE of the second resistive nonvolatile memory element 512 through the fifth switch Q5 and the second row line 532, and the first voltage V1 is transmitted to the top electrode TE of the first resistive nonvolatile memory element 511 through the third switch Q3 and the first row line 531. When the erase voltage EV is transmitted to the bottom electrode BE of the first resistive nonvolatile memory element 511 through the column programming line 520 and the first switch Q1, the first resistive memory element 511 is reset, and the resistance state of the first resistive memory element 511 is changed from the low resistance state to the high resistance state. Since the voltages of the top electrode TE and the bottom electrode BE of second resistive nonvolatile memory element 512 are all the erase voltage EV, the resistance state of the second resistive nonvolatile memory element 512 is not changed.

Deduced by analogy, to reset the resistance state of the second resistive nonvolatile memory element 512 from the low resistance state to the high resistance state, the low level voltage LV can be transmitted to the top electrode TE of the second resistive nonvolatile memory element 512 through the column programming line 520 and the first switch Q1. Since the voltages of the top electrode TE and the bottom electrode BE of the second resistive nonvolatile memory element 512 are respectively the low level voltage LV and erase voltage EV, the resistance state of the second resistive nonvolatile memory element 512 is changed from the low resistance state to the high resistance state. Since the voltages of the top electrode TE and the bottom electrode BE of the first resistive memory element 511 are both low level voltage LV, the resistance state of the first resistive nonvolatile memory element 511 is not changed.

Based on the above description, when the FPGA 120 is in a programming period of the first period T1, the first switch Q1, the third switch Q3, and the fifth switch Q5 are turned on, the fourth switch Q4 is turned off, and the MCU 110 can program an resistance state corresponding to a new function (e.g., the second function) to the first resistive nonvolatile memory element 511 or the second resistive nonvolatile memory element 512 via the first row line 531, the second row line 532, and the column programming line 520. During the programming period, since the output signal of the output terminal Q of the latch unit 513 is not related to the input signal of the data input terminal D of the latch unit 513, the latch unit 513 may keep outputting the first logic level corresponding to the original function (e.g., the first function) to the control terminal of the second switch Q2. The programming of the new function (e.g., the second function) does not affect/interrupt the execution of the original function (e.g., the first function).

While the latch unit 513 of the FPGA 120 is in a sampling period, that is, when the control signal line SL has the switch pulse Stri, the fourth switch Q4 and the fifth switch Q5 are turned on, and the first switch Q1 and the third switch Q3 are turned off. During the sampling period, the latch unit 513 is triggered by a signal from the gate terminal E to sample the input signal of the data input terminal D, i.e. samples a divided voltage formed by the first nonvolatile memory element 511 and the second nonvolatile memory element 512. For instance (but not limited to), during the sampling period, the first voltage V1 and the read voltage Vr are both set as a system voltage Vcc (e.g., lower than the clamp voltage of the first resistive nonvolatile memory element 511), and the voltages of the second voltage V2 and the column programming line 520 are both set as the low level voltage LV (e.g., the ground voltage or 0 voltage). When the resistance state of the first resistive nonvolatile memory element 511 is the high resistance state and the resistance state of the second resistive nonvolatile memory element 512 is the low resistance state, the logic value sampled by the latch unit 513 during the sampling period through the data input terminal D is 0. When the resistance state of the first resistive nonvolatile memory element 511 is the low resistance state and the resistance state of the second resistive nonvolatile memory element 512 is the high resistance state, the logic value sampled by the latch unit 513 during the sampling period through the data input terminal D is 1. As a result, the FPGA 120 may terminate the first period T1 after receiving the switch pulse Stri, and can be instantly switched from the original function (e.g., the first function) to the new function (e.g., the second function) without extra waiting time.

Note that the function programmable circuit 100 may close the input terminal D of the latch unit 513 during a non-sampling period (retention period), such that the output terminal Q of the latch unit 513 keeps the sampling result of the latch unit 513. Therefore, during the non-sampling and a non-programming period, the top electrodes TE and bottom electrodes BE of all resistive nonvolatile memory elements of all of the memory blocks 501A~501D are unnecessary to be supplied with power, so as to reduce current leakage of a voltage-dividing circuit to effectively reduce power consumption.

Figure 6:
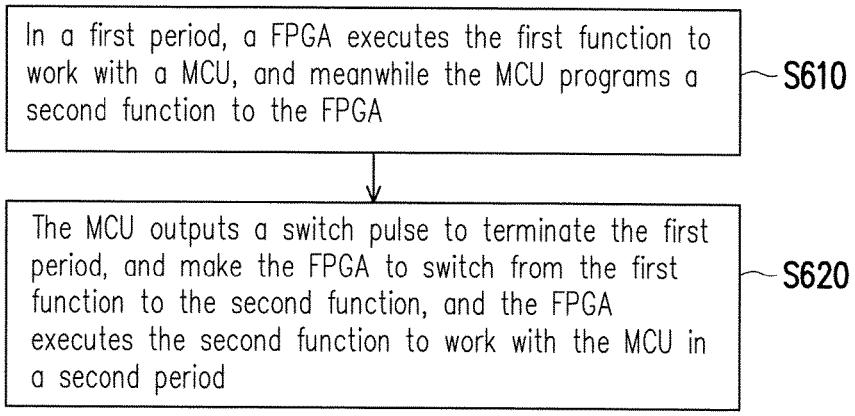
FIG. 6 is a flowchart illustrating an operation method of the function programmable circuit according to an embodiment of the disclosure.

Refer to FIG. 6. FIG. 6 is a flowchart illustrating an operation method of a function programmable circuit according to an embodiment of the disclosure. In step S610, in the first period, a FPGA executes the first function to work with a MCU, and meanwhile the MCU programs a second function to the FPGA. In step S620, the MCU outputs a switch pulse to terminate the first period, and make the FPGA to switch from the first function to the second function, and the FPGA executes the second function to work with the MCU in the second period. Description of the previous embodiments can be referred for the operation method of the present embodiment, and detail thereof is not repeated.

The MCU 110 and the FPGA 120 of the aforementioned embodiments can be applied to a communication device. The MCU 110 and the FPGA 120 may provide a bottom layer (for example, a physical layer) communication function. Based on programming, the FPGA 120 may have a communication interface used for implementing data transmission with a remote system (another communication device). The two communication devices may exchange data through an encrypted communication network. The two communication devices may keep repeatedly changing the communication protocol/or other function to improve security of data transmission of the communication network.

Figure 7:
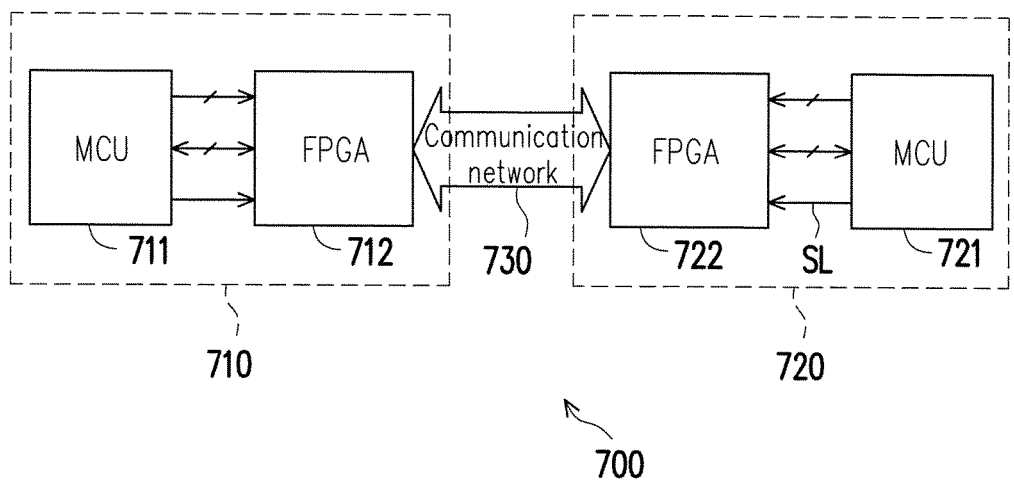
FIG. 7 is a schematic diagram of circuit blocks of a communication system according to an embodiment of the disclosure.

FIG. 7 is a schematic diagram of circuit blocks of a communication system 700 according to an embodiment of the disclosure. The communication system 700 of FIG. 7 includes a first communication device 700 and a second communication device 720. The first communication device 700 may establish a connection with the second communication device 720 through a communication network 730. According to a design requirement, the communication network 730 a wired communication network or a wireless communication network, where the wired communication network can be an Ethernet, an inter-integrated circuit (I$^2$C) network or other wired network, and the wireless communication network can be a wireless fidelity (WiFi) network, a bluetooth or other wireless network. For simplicity's sake, the conventional communication elements such as an antenna, a modulation circuit, etc. are not illustrated in FIG. 7.

The first communication device 710 includes a MCU 711 and a FPGA 712. The second communication device 720 includes a MCU 721 and a FPGA 722. The first communication device 710 and the second communication device 720 can be deduced according to related description of the function programmable circuit 100 of FIG. 1 to FIG. 6, the MCU 711 and the MCU 721 can be deduced according to related description of the MCU 100 of FIG. 1 to FIG. 6, and the FPGA 712 and the FPGA 722 can be deduced according to related description of the FPGA 120 of FIG. 1 to FIG. 6. Based on programming, the FPGA 712 and the FPGA 722 may have a communication interface used for implementing data transmission with a remote system (another communication device). The FPGA 712 and the FPGA 722 may exchange data (e.g., encrypted data) through the communication network 730. The FPGA 712 and the FPGA 722 may use a specific communication protocol to transmit data (e.g., encrypted data) to each other based on programming. Based on the programming operation and control of the MCU 711 and the MCU 721, the FPGA 712 and the FPGA 722 may keep repeatedly changing the communication protocol to improve security of data transmission of the communication network 730.

Figure 8:
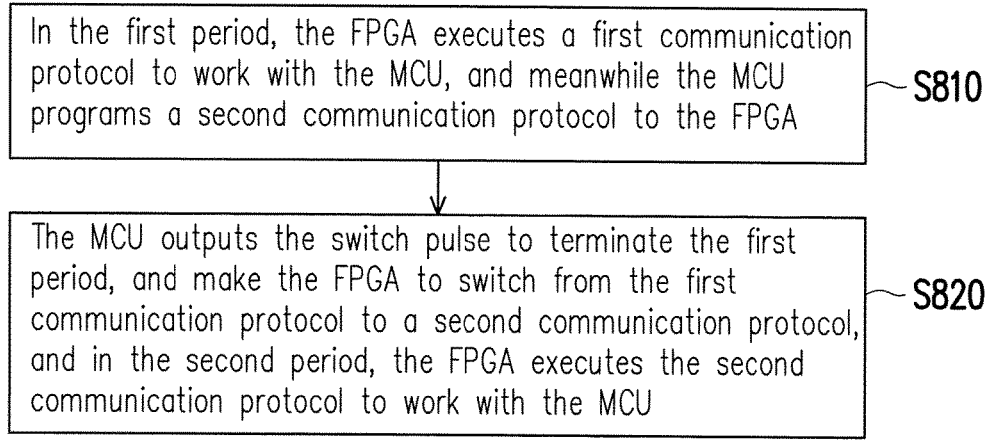
FIG. 8 is a flowchart illustrating an operation method of a communication device according to an embodiment of the disclosure.

FIG. 8 is a flowchart illustrating an operation method of the communication device 720 according to an embodiment of the disclosure. The first communication device 710 shown in FIG. 7 can be deduced according to related description of the second communication device 720, and detail thereof is not repeated. Referring to FIG. 7 and FIG. 8, in the first period, the FPGA 722 executes a first communication protocol to work with the MCU 721 (step S810), so as to communicate with the first communication device 710. Meanwhile (in the same first period), the MCU 721 programs a second communication protocol to the FPGA 722 (step S810).

Figure 9:
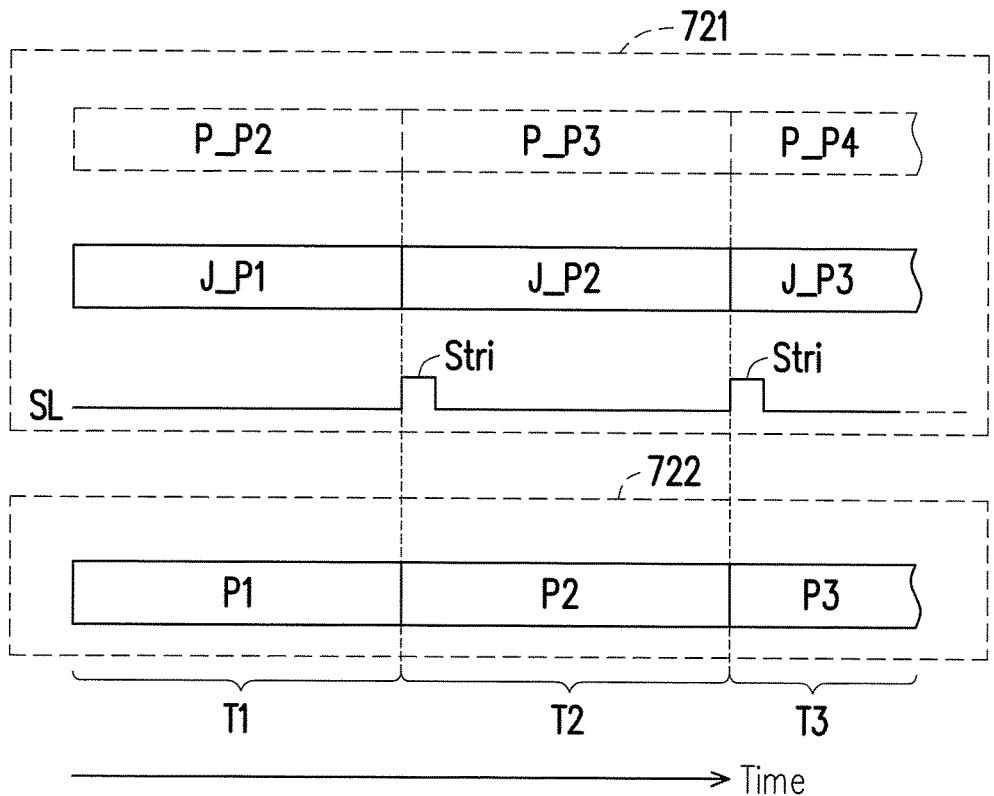
FIG. 9 is a schematic diagram of an operation timing of a FPGA of FIG. 7 according to an embodiment of the disclosure.

FIG. 9 is a schematic diagram of an operation timing of the FPGA 722 of FIG. 7 according to an embodiment of the disclosure. A horizontal axis of FIG. 9 represents time. Referring to FIG. 7 to FIG. 9, in the first period T1, the FPGA 722 executes a first communication protocol P1, and the MCU 721 executes a task J_P1 to work with the MCU 721, so as to communicate with the first communication device 710. Meanwhile (in the same first period T1), the MCU 721 may also execute a task P_P2 while executing the task J_P1, so as to program a second communication protocol P2 to the FPGA 722. The programming of the second communication protocol P2 does not influence/interrupt the execution of the first communication protocol P1.

In step S820, the FPGA 722 is controlled by the switch pulse Stri output by the MCU 721 to terminate the first period T1 and enter the second period T2, and the FPGA 722 is switched from the first communication protocol P1 to the second communication protocol P2, where a resistance state corresponding to the first communication protocol P1 is different to a communication state corresponding to the second communication protocol P2. In the second period T2, the FPGA 722 executes the second communication protocol P2, and the MCU 721 may execute a task J_P2 to work with the MCU 721, so as to communicate with the first communication device 710. Meanwhile (in the same second period T2), the MCU 721 may also execute a task P_P3 while executing the task J_P2, so as to program a third communication protocol P3 to the FPGA 722. The programming of the third communication protocol P3 does not influence/interrupt the execution of the second communication protocol P2.

Deduced by analogy, after the second period T2 is terminated, the third period T3 is entered. In the third period T3, the FPGA 722 executes the third communication protocol P3, and the MCU 721 may execute a task J_P3 to work with the MCU 721, so as to communicate with the first communication device 710. Meanwhile (in the same third period T3), the MCU 721 may also execute a task P_P4 while executing the task J_P3, so as to program a fourth communication protocol to the FPGA 722. The programming of the fourth communication protocol (i.e. execution of the task P_P4) does not influence/interrupt the execution of the third communication protocol P3.

According to the example of FIG. 9, it is known that based on the programming operation and control of the MCU 721, the FPGA 722 may keep repeatedly changing the communication protocol to improve security of data transmission of the communication network 730. In case that the communication protocol is dynamically changed, a hacker is hard to monitor such communication network.

It should be noted that in different applications, related functions of the first communication device 710, the MCU 711, the FPGA 712, the second communication device 720, the MCU 721 and/or the FPGA 722 can be implemented as software, firmware or hardware by using general programming languages (e.g., C or C++), hardware description languages (e.g., Verilog HDL or VHDL) or other suitable programming languages. The programming languages capable of executing the related functions can be can be stored in any computer-assessable medias, for example, magnetic tapes, semiconductor memories, magnetic disks or compact disks, for example, CD-ROM or DVD-ROM, or the programming languages can be transmitted through the Internet, wired communication, wireless communication or other communication media. The programming languages can be stored in the computer-assessable medias to facilitate a processor of the computer to access/execute programming codes of the software (or firmware). Regarding hardware implementation, combined with the patterns disclosed in the embodiments, various schematic logics, logic blocks, modules and circuits in one or a plurality of controllers, micro-controllers, micro processors, application-specific integrated circuits (ASIC), digital signal processors (DSP), field programmable gate arrays (FPGA) and/or other processing units can be used for implementing or executing the functions of the disclosure. Moreover, the device and the method of the disclosure can be implemented through a combination of hardware and software.

In summary, the FPGA described in the embodiments can be controlled by the MCU. In the first period T1, the MCU is capable of programming a second communication protocol to the FPGA while controlling the FPGA to execute the first communication protocol. Therefore, when the FPGA receives the switch pulse Stri from the MCU, the FPGA is capable of switching from the first communication protocol to the second communication protocol instantly and terminating the first period without wasting additional time for programming. Therefore, the communication devices of the embodiments of the disclosure may keep repeatedly changing the communication protocol to improve security of data transmission of the communication network. Additionally, the latch unit of the FPGA may effectively reduce the current leakage of the first resistive nonvolatile memory element and the second resistive nonvolatile memory element, so as to reduce the power consumption of the FPGA.

It will be apparent to those skilled in the art that various modifications and variations can be made to the structure of the present disclosure without departing from the scope or spirit of the present disclosure. In view of the foregoing, it is intended that the present disclosure cover modifications and variations of the present disclosure provided they fall within the scope of the following claims and their equivalents.

What is claimed is:

1. A communication device, comprising:
a micro-controller unit; and
a field programmable gate array, coupled to the micro-controller unit, and configured to execute a first communication protocol to work with the micro-controller unit so as to communicate with another communication device in a first period, and meanwhile the field programmable gate array being programmed with a second communication protocol by the micro-controller unit;
wherein the field programmable gate array is controlled by a switch pulse output by the micro-controller unit to terminate the first period and is switched from the first communication protocol to the second communication protocol, and the field programmable gate array executes the second communication protocol to work with the micro-controller unit so as to communicate with the another communication device in a second period,
wherein a resistance state corresponding to the first communication protocol is different to a resistance state corresponding to the second communication protocol.

2. The communication device as claimed in claim 1, wherein the field programmable gate array further comprises a plurality of memory blocks, and one of the memory blocks comprises:
a first switch, having a first terminal coupled to a column programming line;
a first resistive nonvolatile memory element, having a bottom electrode coupled to a second terminal of the first switch, and a top electrode of the first resistive nonvolatile memory element being coupled to a first row line;
a second resistive nonvolatile memory element, having a top electrode coupled to the bottom electrode of the first resistive nonvolatile memory element, and a bottom electrode of the second resistive nonvolatile memory element being coupled to a second row line;
a latch unit, having a data input terminal coupled to the bottom electrode of the first resistive nonvolatile memory element and the top electrode of the second resistive nonvolatile memory element; and
a second switch, having a control terminal coupled to a data output terminal of the latch unit, a first terminal of the second switch being coupled to an input line of the field programmable gate array, and a second terminal of the second switch being coupled to an output line of the field programmable gate array.

3. The communication device as claimed in claim 2, wherein in the first period, the latch unit keeps outputting a first logic level corresponding to the first communication protocol to the control terminal of the second switch, and meanwhile the micro-controller unit programs a resistance state corresponding to the second communication protocol to the first resistive nonvolatile memory element or the second resistive nonvolatile memory element via the first row line, the second row line, the column programming line, and the first switch.

4. The communication device as claimed in claim 2, wherein the field programmable gate array further comprises:

a third switch, having a first terminal coupled to the first row line, and a second terminal of the third switch being configured to receive a first voltage;

a fourth switch, having a first terminal coupled to the first row line, and a second terminal of the fourth switch being configured to receive a read voltage; and a fifth switch, having a first terminal configured to receive a second voltage, and a second terminal of the fifth switch being coupled to the second row line.

5. The communication device as claimed in claim 4, wherein in a sampling period of the latch unit, the fourth switch and the fifth switch are turned on, the third switch is turned off, and the latch unit samples a divided voltage formed by the first resistive nonvolatile memory element and the second resistive nonvolatile memory element.

6. The communication device as claimed in claim 4, wherein in a programming period within the first period, the first switch, the third switch, and the fifth switch are turned on, the fourth switch is turned off, and the micro-controller unit programs a resistance state corresponding to the second communication protocol to the first resistive nonvolatile memory element or the second resistive nonvolatile memory element via the first row line, the second row line, and the column programming line.

7. The communication device as claimed in claim 4, wherein the field programmable gate array further comprises:

a first logic gate, having an input terminal configured to receive the switch pulse, and an output terminal of the first logic gate bing coupled to a control terminal of the fourth switch; and a second logic gate, having an input terminal coupled to the output terminal of the first logic gate, and an output terminal of the second logic gate being coupled to a gate terminal of the latch unit of each of the memory blocks.

8. An operation method of a communication device, comprising:

executing a first communication protocol by a field programmable gate array to work with a micro-controller unit so as to communicate with another communication device in a first period, and meanwhile programming a second communication protocol to the field programmable gate array by the micro-controller unit ; and outputting a switch pulse by the micro-controller unit to terminate the first period, making the field programmable gate array to be switched from the first communication protocol to the second communication protocol, and executing the second communication protocol by the field programmable gate array to work with the micro-controller unit so as to communicate with the another communication device in a second period, wherein a resistance state corresponding to the first communication protocol is different to a resistance state corresponding to the second communication protocol.

9. A communication system, comprising:

a first communication device; and a second communication device, comprising a micro-controller unit and a field programmable gate array, wherein the field programmable gate array is coupled to the micro-controller unit, the field programmable gate array is configured to execute a first communication protocol to work with the micro-controller unit so as to communicate with the first communication device in a first period, and meanwhile the field programmable gate array is programmed with a second communication protocol by the micro-controller unit, the field programmable gate array is controlled by a switch pulse output by the micro-controller unit to terminate the first period, and switched from the first communication protocol to the second communication protocol, and the field programmable gate array executes the second communication protocol to work with the micro-controller unit so as to communicate with the first communication device in a second period, wherein a resistance state corresponding to the first communication protocol is different to a resistance state corresponding to the second communication protocol.

* * * * *